United States Patent [19]
Kwan et al.

[11] Patent Number: 5,316,959
[45] Date of Patent: May 31, 1994

[54] TRENCHED DMOS TRANSISTOR FABRICATION USING SIX MASKS

[75] Inventors: Sze-Hon Kwan, San Francisco; Fwu-Iuan Hshieh, San Jose; Mike F. Chang, Cupertino; Yueh-Se Ho, Sunnyvale; King Owyang, Atherton, all of Calif.

[73] Assignee: Siliconix, Incorporated, Santa Clara, Calif.

[21] Appl. No.: 928,909

[22] Filed: Aug. 12, 1992

[51] Int. Cl.⁵ .......................................... H01L 21/336
[52] U.S. Cl. .......................................... 437/40; 437/203
[58] Field of Search .................. 437/40, 41, 67, 203; 257/328, 330, 334

[56] References Cited

U.S. PATENT DOCUMENTS 5,019,526  5/1991  Yamane et al. ................... 437/70

FOREIGN PATENT DOCUMENTS 3932621  9/1989  Fed. Rep. of Germany .
2647596  5/1990  France .
1198076  8/1989  Japan .
1310576 12/1989  Japan .
2-91976  3/1990  Japan .

OTHER PUBLICATIONS

Chang, T., et al, "Vertical FET . . . Deep Trench Isolation", *IBM Tech. Disc. Bull.* vol. 22, No. 8B Jan. 1980 pp. 3683-3687.
Ou-Yang, P., "Double Ion Implanted V-MOS Technology", *IEEE Journal of Solid State Circuits*, vol. SC-12, No. 1, Feb. 1977, pp. 3-8.
International Electron Devices Meeting, 9 Dec. 1990, San Francisco, USA, pp. 793-797, K. Shenai, et al.

*Primary Examiner*—George Fourson
*Attorney, Agent, or Firm*—Skjerven, Morrill, MacPherson, Franklin & Friel

[57] ABSTRACT

A trenched DMOS transistor is fabricated using six masking steps. One masking step defines both the P+ regions and the active portions of the transistor which are masked using a LOCOS process. The LOCOS process also eliminates the poly stringer problem present in prior art structures by reducing the oxide step height. A transistor termination structure includes several field rings, each set of adjacent field rings separated by an insulated trench, thus allowing the field rings to be spaced very close together. The field rings and trenches are fabricated in the same steps as are corresponding portions of the active transistor.

8 Claims, 2 Drawing Sheets

TRENCHED DMOS TRANSISTOR FABRICATION USING SIX MASKS

BACKGROUND OF THE INVENTION

1. Field of the Invention

This invention relates to a method for fabricating a trenched DMOS transistor using six masking steps, resulting in a transistor having narrow trenches, shallow diffusions, and formed using relatively few process steps.

2. Description Of The Prior Art

DMOS transistors are well known as a type of MOSFET (metal on semiconductor field effect transistor) using diffusions to form the transistor regions, with a typical application being as a power transistor. Such devices enjoy widespread use in such applications as automobile electrical systems, power supplies, and power management applications.

Many different processes have been used for the fabrication of power MOSFET devices over the years; these are generally deep diffusion processes. It is also well known to form such transistors having a trench in the substrate, the trench being lined with a thin oxide layer and filled with a conductive polysilicon to form the transistor gate structure.

Prior art trenched DMOS transistors have the shortcoming that typically it takes a fairly large number (such as eight or nine) fabrication masking steps to define the various transistor regions, including the tubs in which the active transistor regions are formed, the body region of the transistor, the source region of the transistor, the body contact regions, each of which are separate diffusions, and the termination structures, i.e. field plates and field rings. Additional masking steps are used to define the oxide layers and polysilicon portions of the transistor. Each additional masking step requires a mask alignment and thus results in the possibility of alignment error, undesirably reducing yield. Additionally, the many process steps which include temperature cycles tend to result in unwanted diffusion of certain of the implanted ions, thus undesirably altering the lateral extent and/or depth of various of the diffused regions.

Thus there is a need for transistor fabrication processes using relatively few masks.

It is also desirable in fabrication of such a device to eliminate the polysilicon ("poly") stringer problem. Polysilicon stringers are typically formed when a layer of polycrystalline silicon ("polysilicon") is deposited over for instance an oxide layer which includes a step structure. Subsequent etching down of the polysilicon layer results in a portion of the polysilicon remaining adjacent to the step, since the polysilicon layer is thickest at that point. This "stringer" portion causes significant performance problems in the resulting transistor.

SUMMARY OF THE INVENTION

In accordance with the invention, a trenched DMOS transistor is formed having relatively narrow and relatively shallow trenches in one embodiment. The associated transistor active regions are relatively shallow diffusions. Only six masking steps are required because one mask is used to define both the deep body and the active areas of the transistor, i.e. establish the location of the tubs, and also to determine where local oxidation is to take place defining the field oxide portions of the transistor. Thus both the prior art first mask which is typically used to define the tub region and the prior art second mask which is used to define the field oxidation regions are combined into one local oxidation of silicon (LOCOS) masking step.

Additionally, the fabrication process is simplified by eliminating any dedicated photoresist masking step for definition of both the body region and the source regions of the transistor. Instead, these regions are defined by the earlier active region mask which is patterned to define portions of the body regions and source regions and further by implanting and diffusing the body regions and source regions subsequent to gate trench formation, thus using the gate trench sidewalls partly to define the lateral extent of the source regions and body regions.

This is in contrast to the prior art which instead uses a dedicated photoresist mask layer for defining both the body regions and the source regions. Implanting of the body and source regions after formation of the trenches advantageously provides better control of the channel length of the completed transistors. Forming the body regions relatively late in the process advantageously exposes the body regions to fewer temperature cycles during fabrication and hence allows more accurate definition of the depth of the body diffusions. Additionally, formation of the trench prior to formation of the body regions advantageously allows easier repair of etch damage to the trench sidewalls.

DETAILED DESCRIPTION OF THE INVENTION

The present invention is to be understood in the context of the copending and commonly owned patent applications, incorporated herein by reference. The first of these is U.S. Pat. Application Ser. No. 07/881,589 filed May 12, 1992, pending, entitled "Low On-Resistance Power MOS Technology", inventors Hamza Yilmaz et al., which describes inter alia a method for fabricating a DMOS transistor using five masking steps. The third is U.S. Pat. Application Ser. No. 07/918,996, filed Jul. 23, 1992, pending, entitled "Field Effect Transistor Having Edge Termination Utilizing Trench Technology", inventor Izak Bencuya. Of these the last is the most relevant in describing a structure produced by the process described in the present application. It is to be understood, however, that the fabrication process disclosed herein is not limited to fabrication of the structure disclosed in the last mentioned copending application (which is the same as the structure disclosed in the present specification), but has more general applicability to transistor fabrication, irrespective of the particular termination structure to which the last mentioned above-referenced patent application is directed.

Advantageously, the structure and method in accordance with the invention eliminate masking steps required in prior art processes, and may dispense with formation of a thick gate oxide, and yet still in one embodiment achieves breakdown voltage far in excess of that of the active cell transistor portion of the transistor. These characteristics are especially beneficial when high breakdown voltages are required and shallow junctions are required in accordance with high cell density. The active transistor cells are square or any other convenient geometry.

A process in accordance with the invention and using six masking steps is described hereinafter.

Figure 1A:
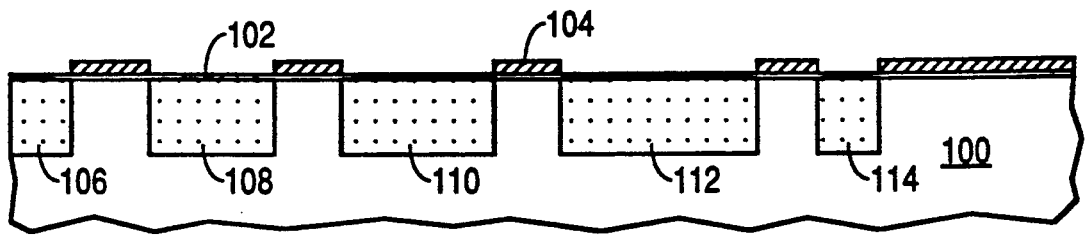
FIGS. 1a through 1j show in cross section a sequence of steps to form a transistor in accordance with the present invention.

In FIG. 1a an N-channel process in accordance with the invention uses an N- doped epitaxial layer 100 having a resistivity of for example 0.85 to 1 ohm-cm formed on an N+ doped silicon substrate having a resistivity of for example 0.001 to 0.005 ohm-cm and which is 5 to 10 microns (micrometers) thick (not shown). The substrate is about 500 μm thick. A thin layer of silicon dioxide 102 300 Å to 500 Å thick is thermally grown on the principal surface of the epitaxial layer 100 and a mask layer of silicon nitride 104 is deposited thereon. Mask layer 104 is conventionally patterned and etched. Then boron is predeposited by using the boron nitride process or by implanting boron at an energy of 40 to 60 KeV and a dose of $2\times10^{13}$ to $1\times10^{16}$/cm$^2$ through the mask layer 104 and driven in to form P+ deep body regions 106, 108 which are about 2 to 3 microns deep and having a final concentration at the principal surface of $1\times10^{16}$ to $2\times10^{19}$/cm$^3$, and similar P+ field rings (termination structures) 110, 112, 114.

Figure 1B:
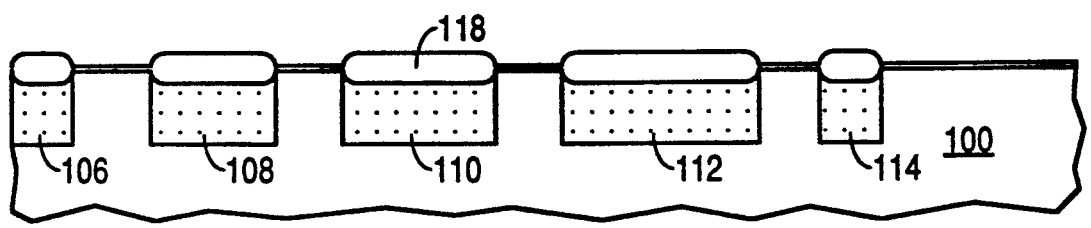

Then local oxidation (LOCOS) 118 of silicon to a thickness of 5,000 to 8,000 Å in FIG. 1b is followed by stripping of the nitride mask layer 104 to define both the active transistor cells and the device termination portion. (It is to be understood that in FIGS. 1a to 1j, the device termination region is located at the right hand side of the figures and the central active cell portion of the transistor is at the left hand portion of the figures. Also, the process steps are shown schematically and not to scale.)

Figure 1C:
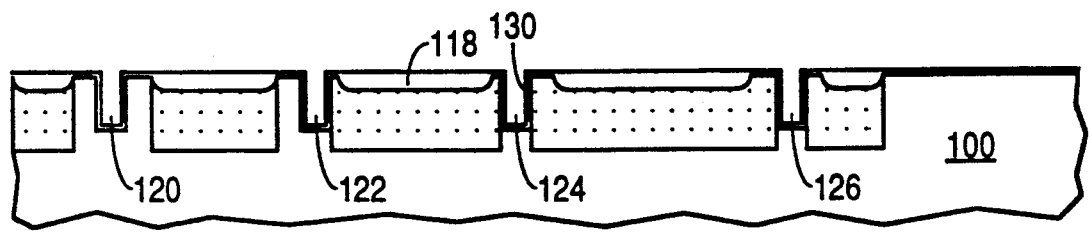

Then in FIG. 1c an LTO (low temperature oxide) second mask layer (not shown) is conventionally deposited and patterned, and trenches 120, 122, 124, 126 are each formed by anisotropic reactive ion dry etching to a depth of 1.5 to 3 microns and a width of 1 to 2 microns. Trenches 120, 122, 124 serve as the gate electrode trenches and trenches 124, 126 separate the field rings from adjacent structures. After the trench walls and corners are smoothed by an isotropic plasma round hole etch and a sacrificial oxide growth and subsequent stripping of the sacrificial oxide, the gate oxide layer 130 is conventionally grown on the sidewalls of the trenches 120, 122, . . . , 126 to a thickness of 400–800 Å.

Figure 1D:
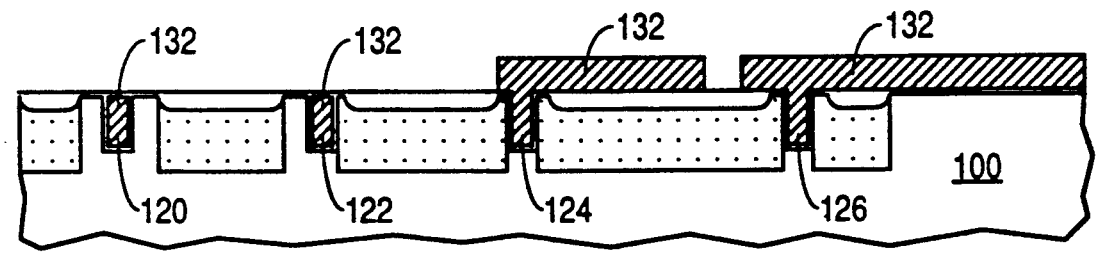

Then in FIG. 1d the trenches are planarized by the deposition of a layer of polycrystalline silicon 132 which is at least as thick as the width of each trench. This relatively thick polysilicon layer 132 is partially dry etched away (without a mask) leaving a thickness of 0.5 microns. By protecting the principal surface with photo resist (not shown), the substrate back side polysilicon and oxide layers are removed by wet chemical etch. The remaining polysilicon 132 is then doped to less than 2 ohm/square. Then masking of polysilicon 132 and a second polysilicon etching is performed, resulting in the structure of FIG. 1d defining windows for subsequent processing. The use of the LOCOS oxide process eliminates the prior art "poly stringer" problem by reducing the oxide step height.

Figure 1E:
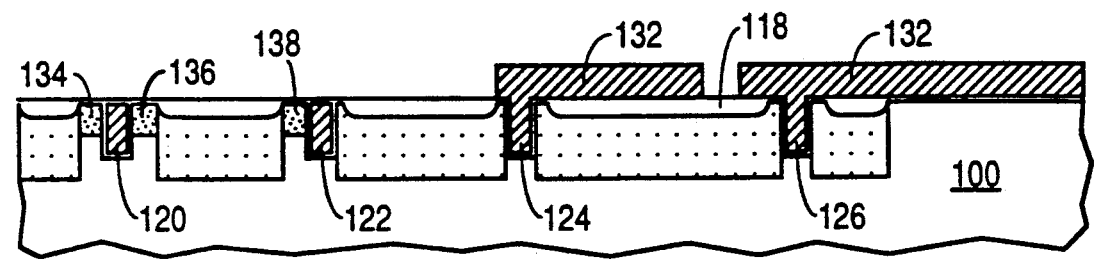

This is followed in FIG. 1e by a blanket boron P-body implant and diffusion at an energy of about 60 KeV and dose of $3\times10^{13}$ to $4\times10^{13}$/cm$^2$, providing a final surface concentration of about $2\times10^{17}$/cm$^3$ forming doped regions 134, 136, 138.

Figure 1F:
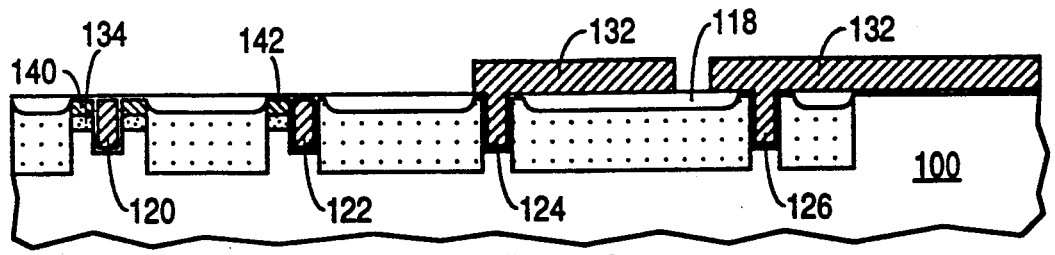

Then a blanket N+ arsenic source implant and diffusion are performed at an energy of 60 to 120 KeV at a dosage of $1\times10^{15}$ to $1\times10^{16}$/cm$^2$ to achieve a final surface concentration of $5\times10^{19}$/cm$^3$ in FIG. 1f forming regions 140, 142. The N+ source junction 140, 142 depth is about 0.5 microns.

Figure 1G:
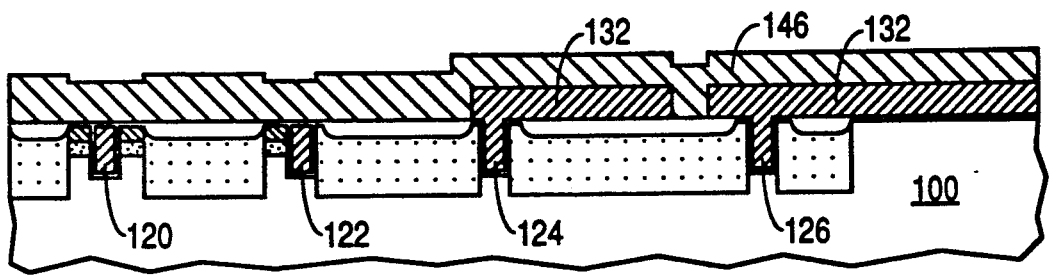

Then in FIG. 1g a layer of boro-phosphosilicate glass (BPSG) 146 is conventionally deposited to a thickness of about 1.35 microns over the entire structure. Then in FIG. 1h BPSG layer 140 is masked and patterned to define the electrical contact openings 150, 152, 154, 156 to the transistor structure. The BPSG layer 140 is then conventionally reflowed to smooth the corners.

Figure 1H:
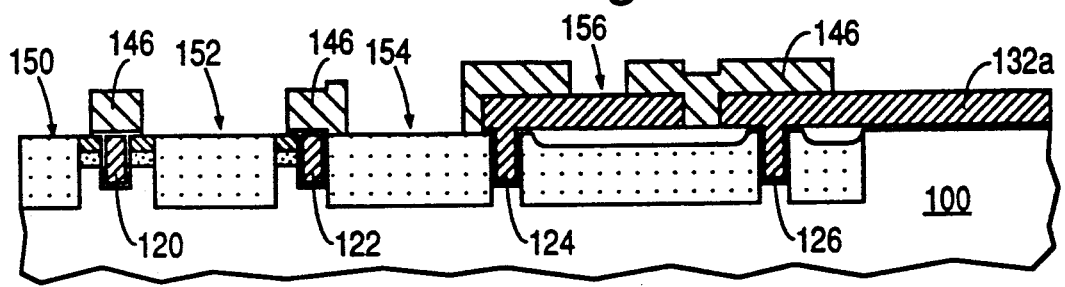
Figure 1I:
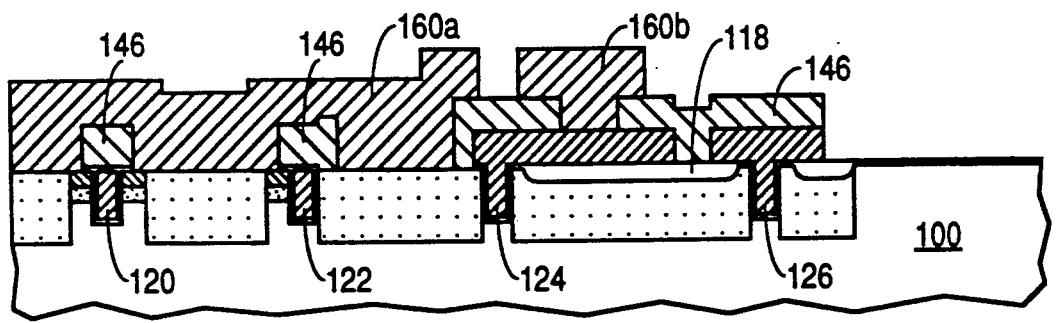

Then in FIG. 1i a layer of metal 160 (e.g. aluminum or aluminum plus 1% silicon) is deposited such as by sputtering over the entire structure and etched using a conventional patterned metal mask layer. The polysilicon 132a at the edge termination is also etched away in this same step. In this wet metal etch and silicon residue removal etching step, the metal layer 160 is etched away in the termination region and this step also etches away unneeded portions 132a of the polysilicon layer in this region. Thus no separate masking layer is needed to remove unneeded polysilicon 132a in this step.

Figure 1J:
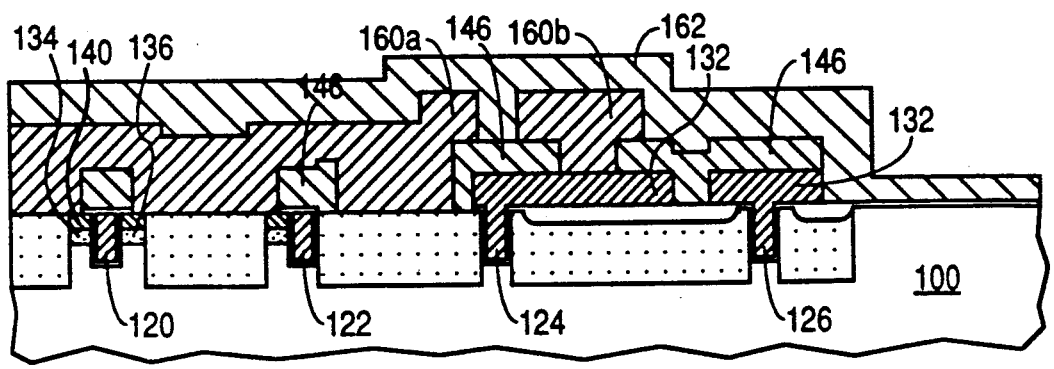

Then in FIG. 1j a passivation layer 162 such as PSG or plasma nitride is conventionally deposited and by a mask step bonding pad holes (not shown) to contact the gate and source area are opened therethrough.

As will be recognized, six masking steps are thereby utilized in one embodiment of the fabrication process described in FIGS. 1a to 1j of the present invention. These six masking steps are as follows:

1) a deep body P+ and LOCOS masking step in which openings are formed in layer 102 as shown in FIG. 1a through which a P+ region is doped and LOCOS 118 is grown;

2) a trench masking step in which a portion of photoresist is formed to define the trenches 120, . . . , 126 shown in FIG. 1c;

3) a polysilicon masking step in which portions of photoresist are used to protect and thereby to form the portions of polysilicon layer 132 shown in FIG. 1d;

4) a contact hole masking step in which portions of a BPSG layer 146 are removed to form a contact to the P+ regions and to form a contact to the polysilicon in trench 124 of FIG. 1h.

5) a metal masking step in which portions of a metal layer 160 are removed to form the metal source electrode 160(a), the metal gate finger 160(b), of FIG. 1i; and 6) a pad masking step in which portions of passivation layer 162 are removed to expose portions of a gate bonding pad and source bonding pad.

It is to be understood that the above-described process is for fabricating an N-channel vertical DMOS transistor device as shown. By reversal of the various polarities to the opposite type, a P-channel vertical DMOS transistor structure may also be formed.

Also, with reference to the structure of FIG. 1j, the field rings 112, 114 are separated by insulated trench 126, thus allowing the field rings to be closely spaced together and hence conserving chip surface area. More field rings can be formed in a similar way. Trench 126 is filled with polysilicon that is electrically floating. Trench 124 is also filled with polysilicon and is electrically connected to the gate finger electrode connected in turn (outside the plane of FIG. 1i) to the polysilicon which is filling trenches 120, 122. The drain electrode is conventionally formed on the back side (not shown) of the substrate.

The area immediately to the right of trench 122 has no active (source or body) regions and hence serves as a dummy cell adjacent to the termination structures; this dummy cell can be dispensed with in one embodiment. Also, the above described process can be implemented in a transistor having a termination other than that described herein.

The above description is illustrative and not limiting; further modifications will be apparent to one skilled in the art in light of this specification and the appended claims.

We claim:

1. A method for forming a field effect transistor comprising:
   providing a semiconductor substrate having a principal surface and being of a first conductivity type;
   forming a patterned mask layer on the principal surface;
   doping semiconductor regions of a second conductivity type in the portions of the substrate exposed by the mask layer, thereby forming deep body regions of the transistor;
   growing an oxide layer on the portions of the principal surface exposed by the mask layer;
   forming a plurality of trenches in the substrate;
   forming a layer of conductive material in the trenches and over at least a part of the oxide layer, the portion of the conductive material layer in the trenches being a gate of the transistor;
   forming doped first regions of the second conductivity type in the substrate extending from the portions of the principal surface not covered by the oxide layer or the layer of conductive material into the substrate;
   forming doped second regions of the first conductivity type extending from the unmasked portions of the principal surface into the substrate, the first and second doped regions respectively being body and source regions of the transistor;
   forming a patterned insulating layer overlying the principal surface and the conductive material layer; and
   forming a patterned interconnect layer overlying the principal surface and over the patterned insulating layer and contacting the deep body, body, and source regions, and the gate electrode.

2. The method of claim 1, wherein the step of growing an oxide layer comprises locally oxidizing the exposed portions of the principal surface to form a layer in the range of about 5,000 to about 8,000 Å thick.

3. The method of claim 1, wherein the step of forming a plurality of trenches comprises:
   anisotropically etching a plurality of U-shaped trenches;
   smoothing the trench walls and rounding the trench corners by an isotropic plasma dry etch;
   growing a layer of sacrificial oxide on the sidewalls of the trenches; and
   removing at least part of the layer of sacrificial oxide.

4. The method of claim 3, wherein the step of forming the doped first regions is after the step of forming the plurality of trenches.

5. The method of claim 4, wherein the depth of the trenches is in the range of about 1.5 to about 3 microns.

6. The method of claim 1, wherein the step of forming a layer of conductive material comprises:
   depositing a layer of material in the trenches and overlying the principal surface;
   etching away a portion of the deposited layer;
   doping remaining portions of the deposited layer;
   forming a patterned mask layer over the doped deposited layer portions; and
   etching away those portions of the doped deposited layer exposed by the patterned mask layer, wherein the trenches are filled with the doped deposited layer, and the doped deposited layer is over the oxide layer only in a termination region of the transistor.

7. The method of claim 6, wherein the step of forming a patterned interconnect layer comprises:
   depositing a layer of metal overlying the principal surface and the patterned insulating layer;
   forming a patterned mask layer over the layer of metal;
   etching away those portions of the metal layer exposed by the patterned mask layer, and further etching away in the same step that portion of the doped deposited layer in the termination region that is not overlain by the patterned insulating layer.

8. A method for forming a field effect transistor comprising the steps of:
   providing a semiconductor substrate having a principal surface and being of a first conductivity type;
   forming a patterned mask layer on the principal surface;
   forming a doped deep body region of a second conductivity type of the transistor in a portion of the substrate underlying the portions of the principal surface exposed by the patterned mask layer;
   locally growing oxide on the principal surface at those portions of the principal surface exposed by the patterned mask layer;
   removing the patterned mask layer, thereby exposing additional portions of the principal surface; and
   forming in those portions of the substrate underlying the exposed additional portions of the principal surface a doped body region, a doped source region, and a gate region of the transistor.

* * * * *